United States Patent
Ikeda et al.

(10) Patent No.: US 9,812,411 B2
(45) Date of Patent: Nov. 7, 2017

(54) SEMICONDUCTOR DEVICE, INVERTER CIRCUIT, AND DRIVE DEVICE

(71) Applicant: Kabushiki Kaisha Toshiba, Minato-ku (JP)

(72) Inventors: Kentaro Ikeda, Kawasaki (JP); Kazuto Takao, Tsukuba (JP); Ryosuke Iijima, Setagaya (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 15/235,404

(22) Filed: Aug. 12, 2016

(65) Prior Publication Data

US 2017/0077048 A1   Mar. 16, 2017

(30) Foreign Application Priority Data

Sep. 11, 2015  (JP) ................................ 2015-179373

(51) Int. Cl.
*H01L 23/64* (2006.01)
*H01L 29/16* (2006.01)
(Continued)

(52) U.S. Cl.
CPC ........ *H01L 23/645* (2013.01); *H01L 23/3735* (2013.01); *H01L 23/427* (2013.01); *H01L 23/585* (2013.01); *H01L 23/62* (2013.01); *H01L 28/40* (2013.01); *H01L 29/1608* (2013.01); *H01L 29/7805* (2013.01); *H02M 7/003* (2013.01)

(58) Field of Classification Search
CPC ............. H01L 29/66795; H01L 29/785; H01L 29/7831; H01L 29/78648; H01L 29/78645
See application file for complete search history.

(56) References Cited

U.S. PATENT DOCUMENTS 5,623,399 A * 4/1997 Ishii ...................... H02M 7/003
363/132
6,028,779 A    2/2000 Sakamoto et al.
(Continued)

FOREIGN PATENT DOCUMENTS

JP    11-155286    6/1999
JP    2005-5593    1/2005
(Continued)

OTHER PUBLICATIONS

U.S. Appl. No. 15/062,421, filed Mar. 7, 2016, Kazuto Takao et al.

*Primary Examiner* — Quoc Hoang
(74) *Attorney, Agent, or Firm* — Oblon, McClelland, Maier & Neustadt, L.L.P.

(57) ABSTRACT

A semiconductor device of an embodiment includes a first electrode, a second electrode facing the first electrode, an alternating-current electrode, a first switching element provided between the first electrode and the alternating-current electrode, and a second switching element provided between the second electrode and the alternating-current electrode. The first switching element and the second switching element are electrically connected in series between the first electrode and the second electrode, and the alternating-current electrode is electrically connected between the first switching element and the second switching element.

20 Claims, 11 Drawing Sheets

(51) Int. Cl.
*H01L 29/78* (2006.01)
*H01L 49/02* (2006.01)
*H01L 23/373* (2006.01)
*H01L 23/58* (2006.01)
*H01L 23/427* (2006.01)
*H01L 23/62* (2006.01)
*H02M 7/00* (2006.01)

(56) References Cited

U.S. PATENT DOCUMENTS

| | | | |
|---|---|---|---|
| 6,943,445 | B2 | 9/2005 | Shirakawa et al. |
| 2013/0222045 | A1 | 8/2013 | Wu |
| 2014/0084993 | A1* | 3/2014 | Takao ............... G05F 3/20 327/534 |
| 2014/0103989 | A1 | 4/2014 | Wu |
| 2015/0155276 | A1 | 6/2015 | Takao et al. |
| 2016/0284683 | A1 | 9/2016 | Takao et al. |

FOREIGN PATENT DOCUMENTS

| | | |
|---|---|---|
| JP | 2007-12721 | 1/2007 |
| JP | 2007-234690 | 9/2007 |
| JP | 2010-73836 | 4/2010 |
| JP | 2015-19110 | 1/2015 |
| JP | 2015-106646 | 6/2015 |
| JP | 2016-181675 A | 10/2016 |

* cited by examiner

SEMICONDUCTOR DEVICE, INVERTER CIRCUIT, AND DRIVE DEVICE

CROSS-REFERENCE TO RELATED APPLICATION

This application is based upon and claims the benefit of priority from Japanese Patent Application No. 2015-179373, filed on Sep. 11, 2015, the entire contents of which are incorporated herein by reference.

FIELD

Embodiments described herein relate generally to a semiconductor device, an inverter circuit, and a drive device.

BACKGROUND

In a power semiconductor module such as a power conversion module, as the speed of a switching operation is increased, occurrence of element breakdown and noise due to an overvoltage in turnoff operation becomes problem. The overvoltage in turnoff operation is proportional to inductance and the time rate of change of the current flowing in the power semiconductor module (di/dt).

If a long switching time is taken in order to suppress the overvoltage, the switching operation becomes slow. At the same time, the switching loss expressed by the time integration of the products of currents and voltages is increased. In order to suppress the overvoltage and reduce the switching loss, it is desired to reduce the inductance of the power semiconductor module.

DETAILED DESCRIPTION

A semiconductor device of an embodiment includes a first electrode, a second electrode facing the first electrode, an alternating-current electrode, a first switching element provided between the first electrode and the alternating-current electrode, and a second switching element provided between the second electrode and the alternating-current electrode, wherein the first switching element and the second switching element are electrically connected in series between the first electrode and the second electrode, and the alternating-current electrode is electrically connected between the first switching element and the second switching element.

Hereinafter, embodiments of the present disclosure will be explained with reference to drawings. Note that, in the below description, the same or similar members, etc. are denoted by the same reference signs, and the description of once explained members, etc. will be appropriately omitted.

First Embodiment

A semiconductor device of the present embodiment is provided with: a first electrode, a second electrode facing the first electrode, an alternating-current electrode, a first switching element provided between the first electrode and the alternating-current electrode, and a second switching element provided between the second electrode and the alternating-current electrode. The first switching element and the second switching element are electrically connected in series between the first electrode and the second electrode, and the alternating-current electrode is electrically connected between the first switching element and the second switching element.

Figure 1A:
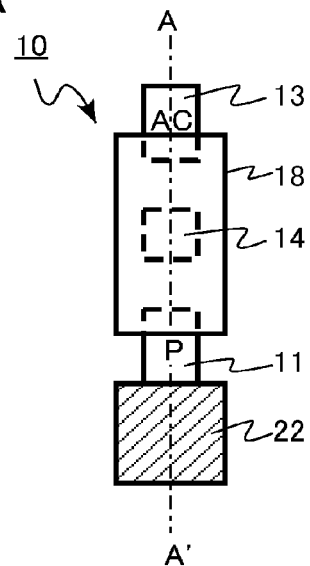
FIGS. 1A, 1B, and 1C are schematic diagrams of a semiconductor device of a first embodiment.
Figure 1B:
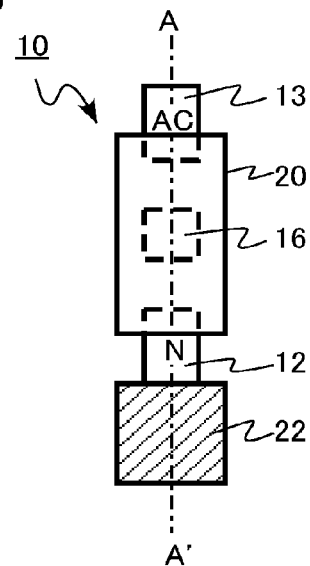
Figure 1C:
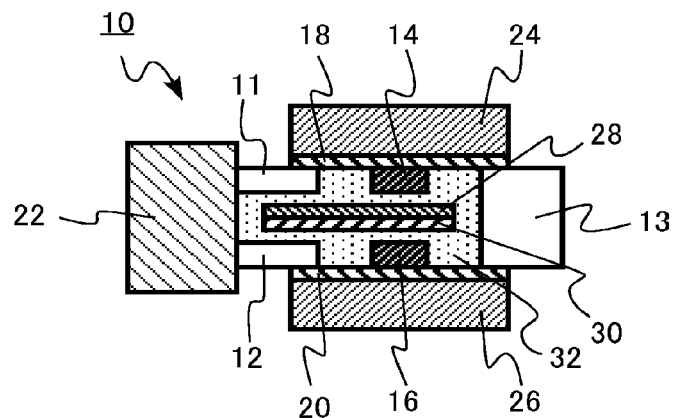
Figure 2:
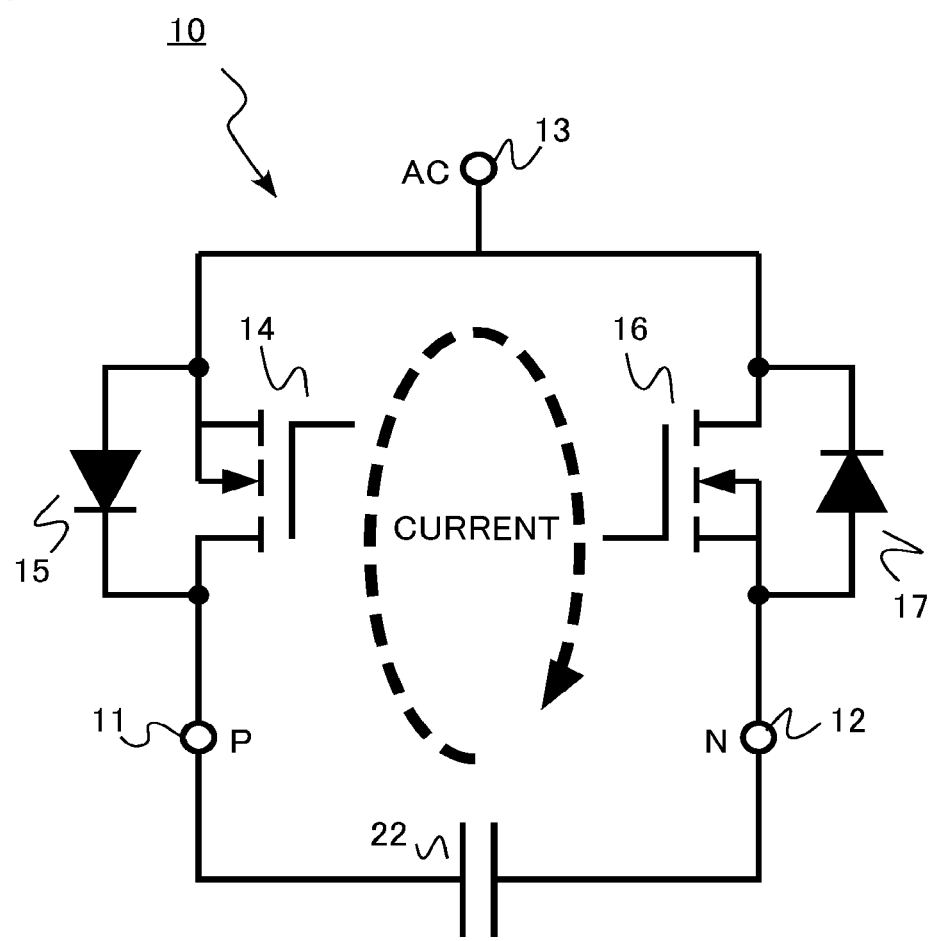
FIG. 2 is an equivalent circuit diagram of a circuit unit of the first embodiment.

FIGS. 1A, 1B, and 1C are schematic diagrams of the semiconductor device of the present embodiment. FIG. 1A is a plan view viewed from a first side, FIG. 1B is a plan view viewed from a second side, and FIG. 1C is an AA' cross-sectional view of FIGS. 1A and 1B. FIG. 2 is an equivalent circuit diagram of the semiconductor device of the present embodiment. The semiconductor device of the present embodiment is a semiconductor module used in an inverter circuit.

A semiconductor module 10 is provided with: a first electrode 11, a second electrode 12, an alternating-current electrode 13, a first switching element 14, a first diode 15, a second switching element 16, a second diode 17, a first substrate 18, a second substrate 20, a capacitor 22, a first heat dissipating plate (first heat dissipator) 24, a second heat dissipating plate (second heat dissipator) 26, a magnetic plate (magnetic body) 28, a heat pipe (cooling mechanism) 30, and a filling material 32. Moreover, the semiconductor module 10 is provided with a gate signal terminal (not shown).

The first electrode 11 and the second electrode 12 are provided facing each other. An electric potential lower than that of the first electrode 11 is applied to the second electrode 12. A positive electric potential is applied to the first electrode 11. The second electrode 12 is grounded, or a negative electric potential is applied thereto.

The first switching element 14 and the first diode 15 are provided between the first electrode 11 and the alternating-current electrode 13. The first switching element 14 and the first diode 15 are mounted on the first substrate 18. The first substrate 18 is an electrically-conductive or insulative substrate.

The second switching element 16 and the second diode 17 are provided between the second electrode 12 and the alternating-current electrode 13. The second switching element 16 and the second diode 17 are mounted on the second substrate 20. The second substrate 20 is an electrically-conductive or insulative substrate.

The first switching element 14 and the second switching element 16 are provided between the first substrate 18 and the second substrate 20.

The second switching element 16 is provided facing the first switching element 14. A plane of the first switching element 14 not in contact with the first substrate 18 and a plane of the second switching element 16 not in contact with the second substrate 20 are opposed to each other. Note that the first switching element 14 and the second switching element 16 are not necessarily required to be completely opposed to each other, but may be misaligned to left/right in terms of position.

The first switching element 14 and the second switching element 16 are electrically connected in series between the first electrode 11 and the second electrode 12. The first switching element 14 and the second switching element 16 are, for example, metal semiconductor field effect transistors (MOSFETs) of silicon carbide (SiC).

The first diode 15 is connected in parallel to the first switching element 14. The second diode 17 is connected in parallel to the second switching element 16. The first diode 15 and the second diode 17 are reflux diodes.

The capacitor 22 is electrically connected between the first electrode 11 and the second electrode 12 in parallel to the first switching element 14 and the second switching element 16.

The distances from the alternating-current electrode 13 to the first electrode 11 and the second electrode 12 are longer than the distance between the first electrode 11 and the second electrode 12.

The alternating-current electrode 13 is electrically connected between the first switching element 14 and the second switching element 16. An alternating-current voltage is output from the alternating-current electrode 13 by controlling the gate voltages of the first switching element 14 and the second switching element 16.

In a state in which the semiconductor module 10 is operating, a current flows in the direction shown by a dotted-line arrow in FIG. 2.

The first switching element 14 and the second switching element 16 are provided between the first heat dissipating plate (first heat dissipator) 24 and the second heat dissipating plate (second heat dissipator) 26.

The first heat dissipating plate 24 is provided to be in contact with the first substrate 18. The first heat dissipating plate 24 is provided with a function to release the heat mainly caused by the first switching element 14 to the outside of the semiconductor module 10.

The second heat dissipating plate 26 is provided to be in contact with the second substrate 20. The second heat dissipating plate 26 is provided with a function to release the heat mainly caused by the second switching element 16 to the outside of the semiconductor module 10.

The magnetic plate (magnetic body) 28 is provided between the first switching element 14 and the second switching element 16. The magnetic plate 28 is, for example, a ferrite plate. The magnetic plate 28 is provided with a function to reinforce the coupling of the magnetic flux generated by the current flowing from the first electrode 11 toward the alternating-current electrode 13 and the current flowing from the alternating-current electrode 13 toward the second electrode 12.

The heat pipe (cooling mechanism) 30 is provided between the first switching element 14 and the second switching element 16. The heat pipe 30 is provided with a function to release the heat mainly caused by the first switching element 14 and the second switching element 16 to the outside of the semiconductor module 10.

The part between the first substrate 18 and the second substrate 20 is sealed by the filling material 32. The filling material 32 is provided with a function to protect the first switching element 14, the second switching element 16, the magnetic plate 28, and the heat pipe 30. The filling material 32 is, for example, silicone gel.

Note that, in FIG. 1, connecting wires such as wires electrically mutually connecting the first electrode 11, the second electrode 12, the alternating-current electrode 13, the first switching element 14, and the second switching element 16 are omitted.

Next, functions and effects of the semiconductor device of the present embodiment will be explained.

Figure 3:
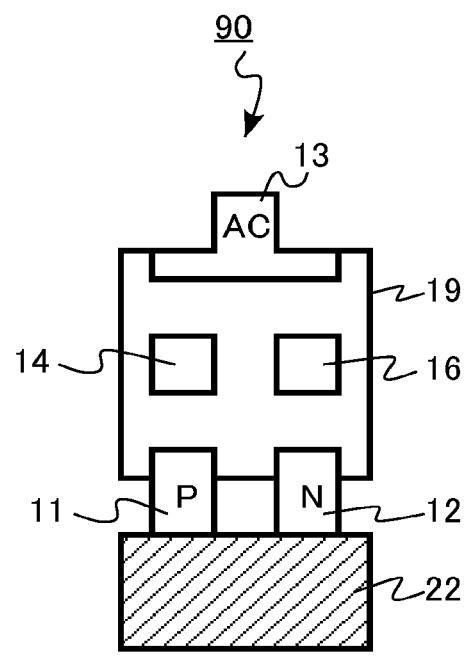
FIG. 3 is a schematic plan view of a semiconductor device of a comparative embodiment.

FIG. 3 is a schematic plan view of a semiconductor device of a comparative embodiment. An equivalent circuit of a semiconductor module 90 of the comparative embodiment is similar to the semiconductor module 10 of the present embodiment shown in FIG. 2.

The semiconductor module 90 of the comparative embodiment is different from the semiconductor module 10 of the present embodiment in a point that the first switching element 14 and the second switching element 16 are mounted in juxtaposition on a single substrate 19. Also, the semiconductor module 90 of the comparative embodiment is different from the semiconductor module 10 of the present embodiment in a point that the first electrode 11 and the second electrode 12 are connected in juxtaposition on the single substrate 19.

Figure 4A:
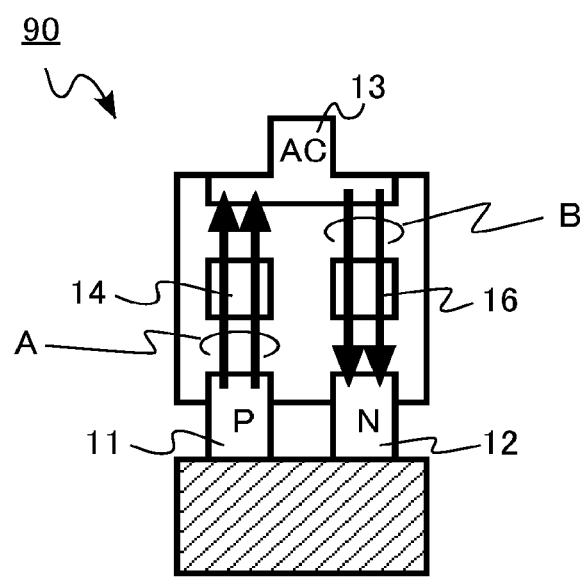
FIGS. 4A and 4B are explanatory drawings of functions of the semiconductor device of the first embodiment.
Figure 4B:
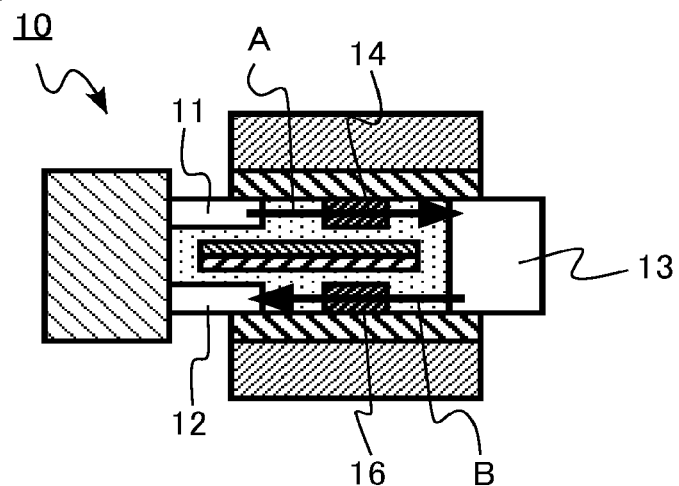

FIGS. 4A and 4B are explanatory drawings of the functions of the semiconductor device of the present embodiment. FIG. 4A is a drawing schematically showing current paths of the semiconductor module 90 of the comparative embodiment. FIG. 4B is a drawing schematically showing current paths of the semiconductor module 10 of the present embodiment.

In a power semiconductor module, mutual inductance is increased by magnetic flux linkages caused by the currents flowing in a closed circuit of the module. As a result, inductance of the whole module is increased, element breakdown and noise may occur, and loss may be increased.

For example, in the case of the semiconductor module 90 shown in FIG. 4A, since the first switching element 14 and the second switching element 16 are disposed on the single plane, the distance between a first current path A from the first electrode 11 toward the alternating-current electrode 13 and a second current path B from the alternating-current electrode 13 toward the second electrode 12 becomes long. Therefore, cancel-out of the magnetic flux between the current path A and the current path B is not sufficient, and suppression of the mutual inductance may be insufficient.

Moreover, in the case of the semiconductor module 90, since the mutual distances of the current flowing in the inner side of the substrate 19 and the current flowing in the outer side of the substrate 19 are different in the first current path A and the second current path B, cancel-out of magnetic flux becomes non-uniform. Therefore, suppression of the mutual inductance may become non-uniform in the module.

As shown in FIG. 4B, in the semiconductor module 10 of the present embodiment, since the first switching element 14 and the second switching element 16 are disposed facing each other, the distance between the current path A and the current path B can be shortened compared with that of the semiconductor module 90 of the comparative embodiment. Therefore, the cancel-out functions of magnetic flux between the current path A and the current path B are increased, and the mutual inductance can be sufficiently suppressed. Therefore, the inductance of the whole semiconductor module 10 can be reduced, element breakdown and noise can be suppressed, and switching loss can be reduced.

Furthermore, in the semiconductor module 10 of the present embodiment, since the first switching element 14 and the second switching element 16 are disposed facing each other, variations in the inter-current distances between the current flowing in the first current path A and the current flowing in the second current path B become small. Therefore, suppression of the mutual inductance can be uniformized in the module.

Note that, in the semiconductor module 10, since the magnetic plate 28 is provided between the first switching element 14 and the second switching element 16, the cancel-out functions of the magnetic flux between the current path A and the current path B further become large. Therefore, the mutual inductance is effectively suppressed by the functions of the magnetic plate 28.

Hereinabove, according to the semiconductor module 10 of the present embodiment, inductance is reduced, occurrence of element breakdown and noise can be suppressed, and switching loss can be suppressed.

Second Embodiment

A semiconductor device of the present embodiment is different from the first embodiment in points that a first substrate on which a first switching element is mounted and a second substrate on which a second switching element is mounted are provided and that the first substrate and the second substrate are provided between the first switching element and the second switching element. Hereinafter, description of the contents redundant with the first embodiment will be omitted.

Figure 5A:
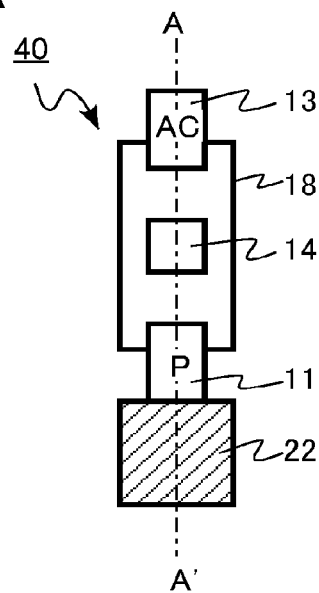
FIGS. 5A, 5B, and 5C are schematic diagrams of a semiconductor device of a second embodiment.
Figure 5B:
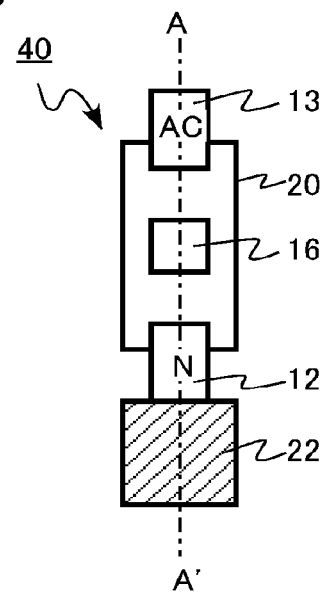
Figure 5C:
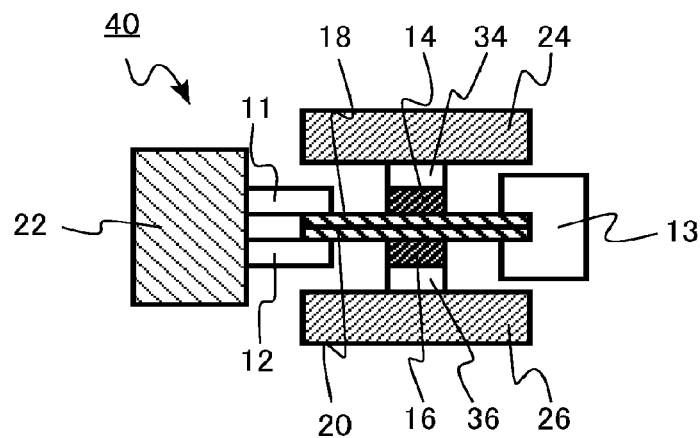

FIGS. 5A, 5B, and 5C are schematic diagrams of the semiconductor device of the present embodiment. FIG. 5A is a plan view viewed from a first side, FIG. 5B is a plan view viewed from a second side, and FIG. 5C is an AA' cross-sectional view of FIGS. 5A and 5B.

A semiconductor module 40 is provided with: the first electrode 11, the second electrode 12, the alternating-current electrode 13, the first switching element 14, the second switching element 16, the first substrate 18, the second substrate 20, the capacitor 22, the first heat dissipating plate (first heat dissipator) 24, the second heat dissipating plate (second heat dissipator) 26, a first connecting member 34, and a second connecting member 36. Moreover, the semiconductor module 40 is provided with a gate signal terminal (not shown).

The first switching element 14 is mounted on the first substrate 18. The second switching element 16 is mounted on the second substrate 20. The first substrate 18 and the second substrate 20 are bonded with each other. The first substrate 18 and the second substrate 20 are provided between the first switching element 14 and the second switching element 16.

The first switching element 14 is connected to the first heat dissipating plate 24 by the first connecting member 34. Moreover, the second switching element 16 is connected to the second heat dissipating plate 26 by the second connecting member 36. The first connecting member 34 and the second connecting member 36 are, for example, metal having high thermal conductivity or ceramics having high thermal conductivity.

Hereinabove, according to the semiconductor module 40 of the present embodiment, as well as the first embodiment, inductance is reduced, occurrence of element breakdown and noise can be suppressed, and switching loss can be suppressed. Particularly, it becomes easy to reduce the distance between the first switching element 14 and the second switching element 16 more than that of the semiconductor module 10 of the first embodiment, and the mutual inductance is easily reduced.

Note that, as well as the semiconductor module 10, the semiconductor module 40 can be provided with a magnetic body or a cooling mechanism.

Third Embodiment

A semiconductor device of the present embodiment is different from the second embodiment in a point that a single substrate having a first plane on which a first switching element is mounted and a second plane on which a second switching element is mounted. Hereinafter, description of the contents redundant with the second embodiment will be omitted.

Figure 6A:
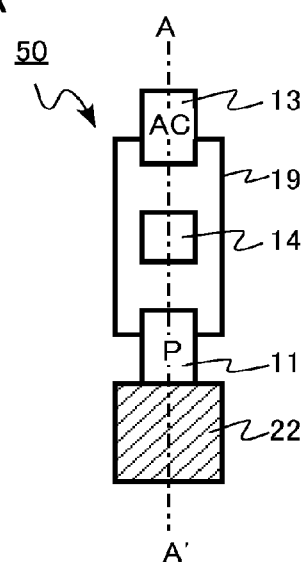
FIGS. 6A, 6B, and 6C are schematic diagrams of a semiconductor device of a third embodiment.
Figure 6B:
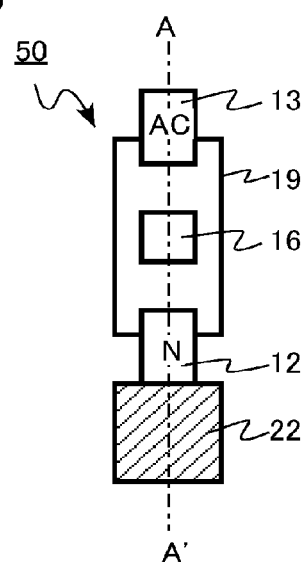
Figure 6C:
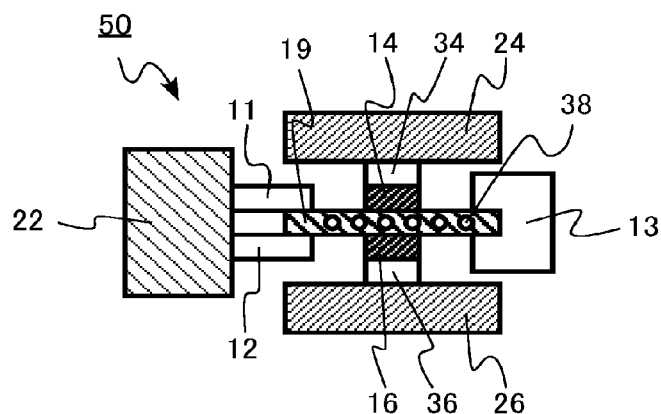

FIGS. 6A, 6B, and 6C are schematic diagrams of the semiconductor device of the present embodiment. FIG. 6A is a plan view viewed from a first side, FIG. 6B is a plan view viewed from a second side, and FIG. 6C is an AA' cross-sectional view of FIGS. 6A and 6B.

A semiconductor module 50 is provided with: the first electrode 11, the second electrode 12, the alternating-current electrode 13, the first switching element 14, the second switching element 16, a substrate 19, the capacitor 22, the first heat dissipating plate (first heat dissipator) 24, the second heat dissipating plate (second heat dissipator) 26, the first connecting member 34, the second connecting member 36, and a cooling-medium flow channel (cooling mechanism) 38. Moreover, the semiconductor module 50 is provided with a gate signal terminal (not shown).

The first switching element 14 is mounted on the first plane of the substrate 19. The second switching element 16 is mounted on the second plane of the substrate 19. The cooling-medium flow channel (cooling mechanism) 38 is provided in the substrate 19. A cooling medium such as water or air can be caused to flow in the cooling-medium flow channel 38.

Hereinabove, according to the semiconductor module 50 of the present embodiment, as well as the first embodiment, inductance is reduced, occurrence of element breakdown and noise can be suppressed, and switching loss can be suppressed. Particularly, it becomes easy to reduce the distance between the first switching element 14 and the second switching element 16 more than that of the semiconductor module 10 of the first embodiment, and the mutual inductance is easily reduced.

Note that, as well as the semiconductor module 10, the semiconductor module 50 can be provided with a magnetic body.

Fourth Embodiment

A semiconductor device of the present embodiment is different from the first embodiment in points that an alternating-current electrode is provided with a first plane and a second plane, that a first switching element is provided on the first plane, and that a second switching element is provided on the second plane. Hereinafter, description of the contents redundant with the first embodiment will be omitted.

Figure 7A:
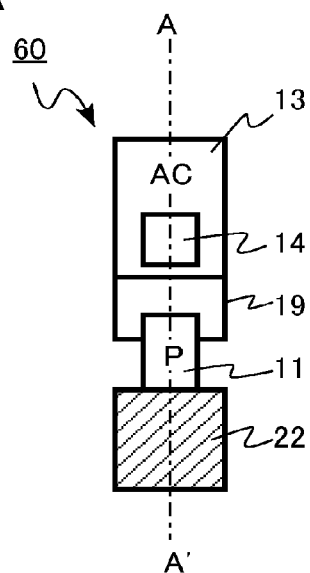
FIGS. 7A, 7B, and 7C are schematic diagrams of a semiconductor device of a fourth embodiment.
Figure 7B:
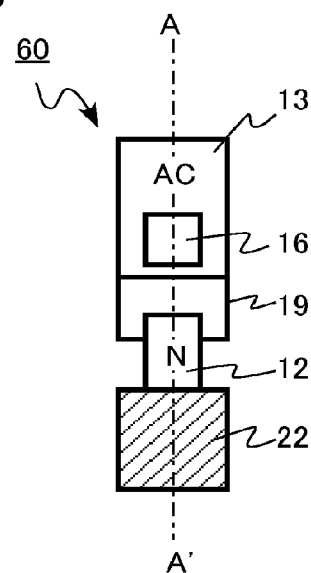
Figure 7C:
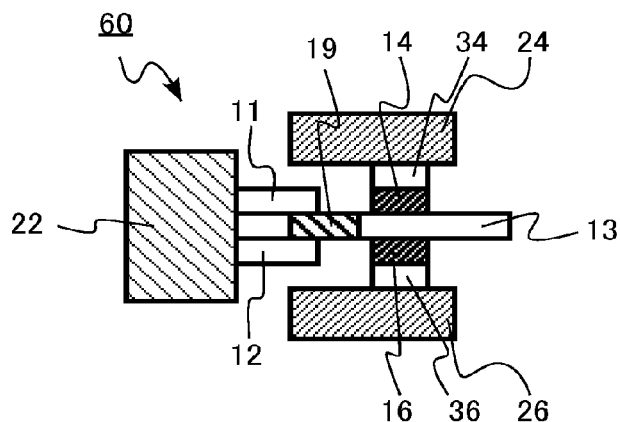

FIGS. 7A, 7B, and 7C are schematic diagrams of the semiconductor device of the present embodiment. FIG. 7A is a plan view viewed from a first side, FIG. 7B is a plan view viewed from a second side, and FIG. 7C is an AA' cross-sectional view of FIGS. 7A and 7B.

A semiconductor module 60 is provided with: the first electrode 11, the second electrode 12, the alternating-current electrode 13, the first switching element 14, the second switching element 16, the substrate 19, the capacitor 22, the first heat dissipating plate (first heat dissipator) 24, the second heat dissipating plate (second heat dissipator) 26, the first connecting member 34, and the second connecting member 36. Moreover, the semiconductor module 50 is provided with a gate signal terminal (not shown).

The alternating-current electrode 13 is provided with the first plane and the second plane. The first switching element 14 is mounted on the first plane of the alternating-current electrode 13. The second switching element 16 is mounted on the second plane of the alternating-current electrode 13. The alternating-current electrode 13 also functions as a heat dissipating plate.

Hereinabove, according to the semiconductor module 60 of the present embodiment, as well as the first embodiment, inductance is reduced, occurrence of element breakdown and noise can be suppressed, and switching loss can be suppressed. Particularly, it becomes easy to reduce the distance between the first switching element 14 and the second switching element 16 more than that of the semiconductor module 10 of the first embodiment, and the mutual inductance is easily reduced.

Moreover, since the alternating-current electrode 13 functions as a heat dissipating plate, the cooling efficiency of the semiconductor module 60 is improved. Moreover, since the alternating-current electrode 13 also serves as part of the substrate, the semiconductor module 60 can be downsized.

Note that, as well as the semiconductor module 10, the semiconductor module 60 can be provided with a magnetic body or a cooling mechanism.

Fifth Embodiment

A semiconductor device of the present embodiment is provided with a plurality of circuit units; each of the circuit units includes: a first electrode, a second electrode provided facing the first electrode, an alternating-current electrode, a first switching element provided between the first electrode and the alternating-current electrode, and a second switching element provided between the second electrode and the alternating-current electrode; the first switching element and the second switching element are electrically connected in series between the first electrode and the second electrode, and the alternating-current electrode is electrically connected between the first switching element and the second switching element. The alternating-current electrodes of the above described circuit units are disposed so as to be laterally juxtaposed. A common electric potential is applied to the first electrodes of the circuit units, and a common electric potential lower than the electric potential applied to the first electrodes is applied to the second electrodes of the circuit units.

Figure 8:
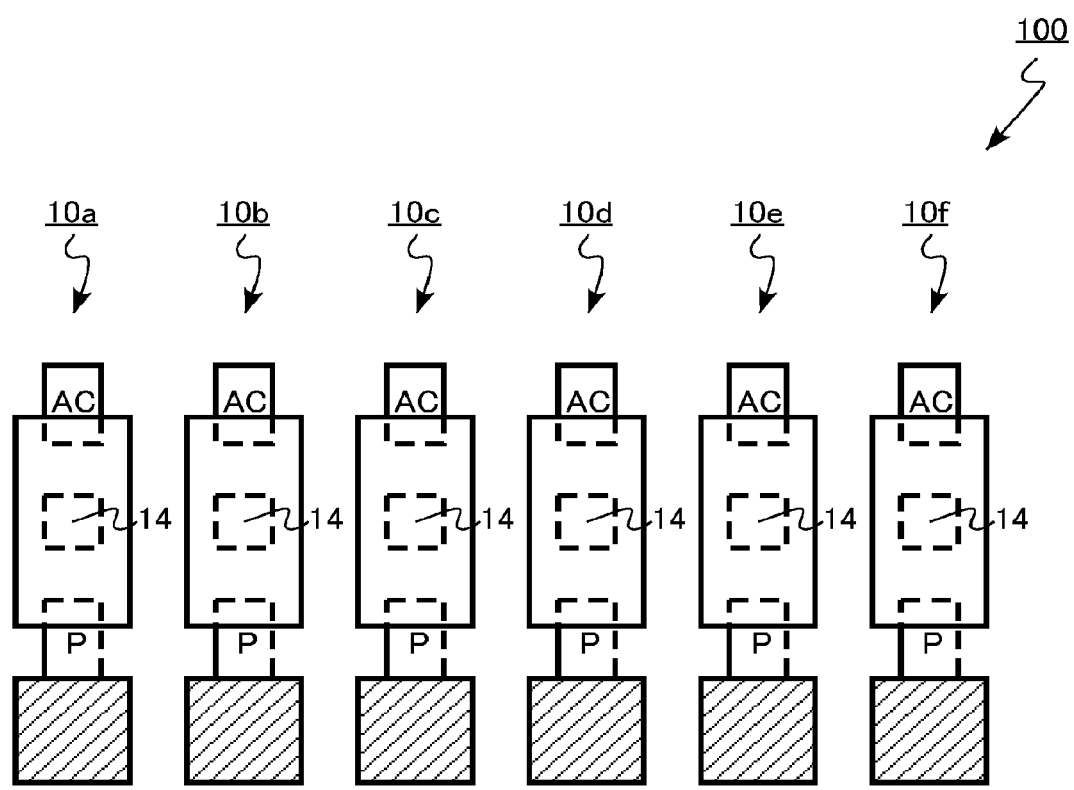
FIG. 8 is a schematic diagram of a semiconductor device of a fifth embodiment.

FIG. 8 is a schematic plan view of the semiconductor device of the present embodiment. The semiconductor device of the present embodiment is a semiconductor module used in an inverter circuit.

The semiconductor module 100 is provided with a plurality of circuit units 10a to 10f. The plurality of circuit units 10a to 10f are provided with the same configuration as the semiconductor module 10 of the first embodiment. Hereinafter, description of the contents redundant with the first embodiment will be omitted.

The plurality of circuit units 10a to 10f are mutually adjacent and disposed in lateral juxtaposition.

Next, functions and effects of the semiconductor device of the present embodiment will be explained.

Since the semiconductor module 100 is divided into the plurality of circuit units 10a to 10f, inductance is reduced. If the mutual inductance of the circuit units 10a to 10f is not considered, the inductance of the semiconductor module 100 is reduced to 1/N by dividing the semiconductor module 100 into N circuit units. Since the number of the circuit units is 6 in the semiconductor module 100, the inductance is reduced to ⅙.

Therefore, the overvoltage in a case of turnoff proportional to inductance and the time rate of change of the current flowing in a power semiconductor module (di/dt) is suppressed.

Moreover, as described in detail in the first embodiment, the mutual inductance of each of the circuit units 10a to 10f is reduced.

According to the present embodiment, the semiconductor module 100 which reduces inductance, can suppress occurrence of element breakdown and noise, and can suppress switching loss is realized.

Note that, herein, the case in which the number of the circuit units is 6 is explained as an example; however, the number of the circuit units is not limited to 6. As long as the number of the circuit units is 2 or more, an arbitrary number thereof can be used.

Sixth Embodiment

In a semiconductor device of the present embodiment, a plurality of circuit units include: a first circuit unit, a second circuit unit adjacent to the first circuit unit, and a third circuit unit adjacent to the second circuit unit; a first switching element of the first circuit unit, a second switching element of the second circuit unit, and a first switching element of the third circuit unit are disposed on a first side of the semiconductor device; a second switching element of the first circuit unit, a first switching element of the second circuit unit, and a second switching element of the third circuit unit are disposed on a second side of the semiconductor device; and the distance between the first circuit unit and the second circuit unit is shorter than the distance between the second circuit unit and the third circuit unit.

Figure 9:
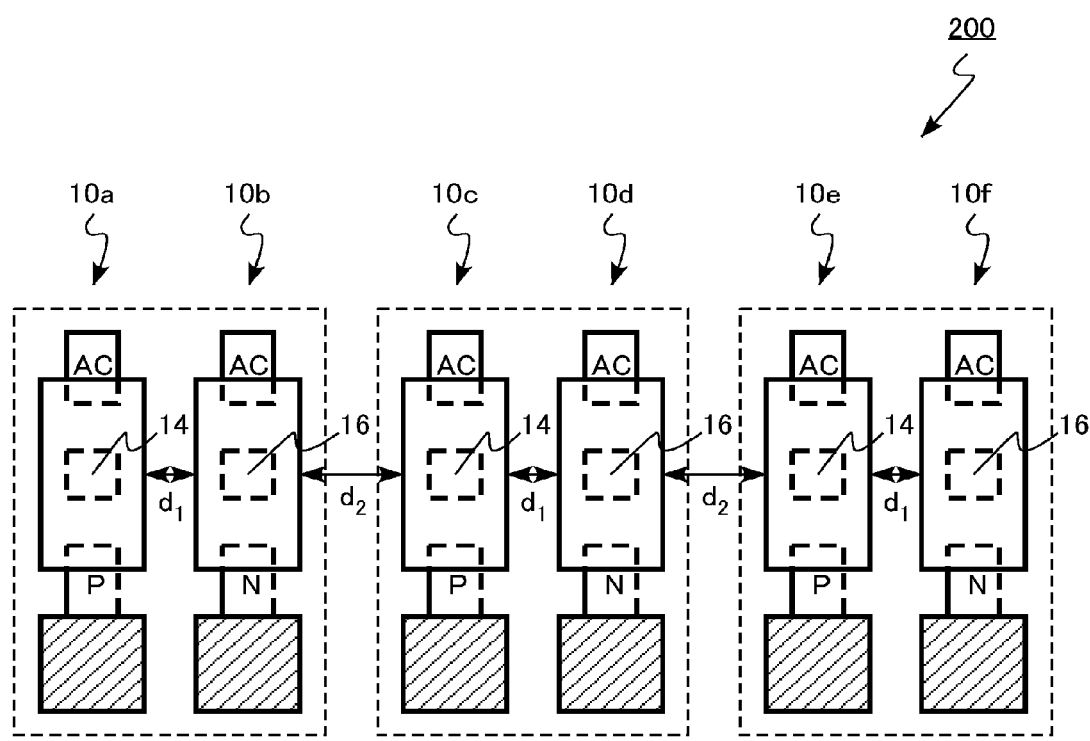
FIG. 9 is a schematic diagram of a semiconductor device of a sixth embodiment.

FIG. 9 is a schematic plan view of the semiconductor device of the present embodiment. The semiconductor device of the present embodiment is a semiconductor module used in an inverter circuit.

A semiconductor module 200 is provided with first to sixth circuit units 10a to 10f. The first to sixth circuit units 10a to 10f are provided with the same configuration as the semiconductor module 10 of the first embodiment. Hereinafter, description of the contents redundant with the first embodiment will be omitted.

The first to sixth circuit units 10a to 10f are mutually adjacent and disposed in lateral juxtaposition. The first circuit unit 10a and the second circuit unit 10b, the third circuit unit 10c and the fourth circuit unit 10d, and the fifth circuit unit 10e and the sixth circuit unit 10f are paired.

The first switching element 14 of the first circuit unit 10a, the second switching element 16 of the second circuit unit 10b, and the first switching element 14 of the third circuit unit 10c are disposed on a front side (first side) of the semiconductor module 200. Moreover, the second switching element 16 of the first circuit unit 10a, the first switching element 14 of the second circuit unit 10b, and the second switching element 16 of the third circuit unit 10c are disposed on a back side (second side) of the semiconductor module 200.

The distance between the first circuit unit 10a and the second circuit unit 10b ($d_1$ in FIG. 9) is shorter than the distance between the second circuit unit 10b and the third circuit unit 10c ($d_2$ in FIG. 9).

Next, functions and effects of the semiconductor device of the present embodiment will be explained.

Figure 10:
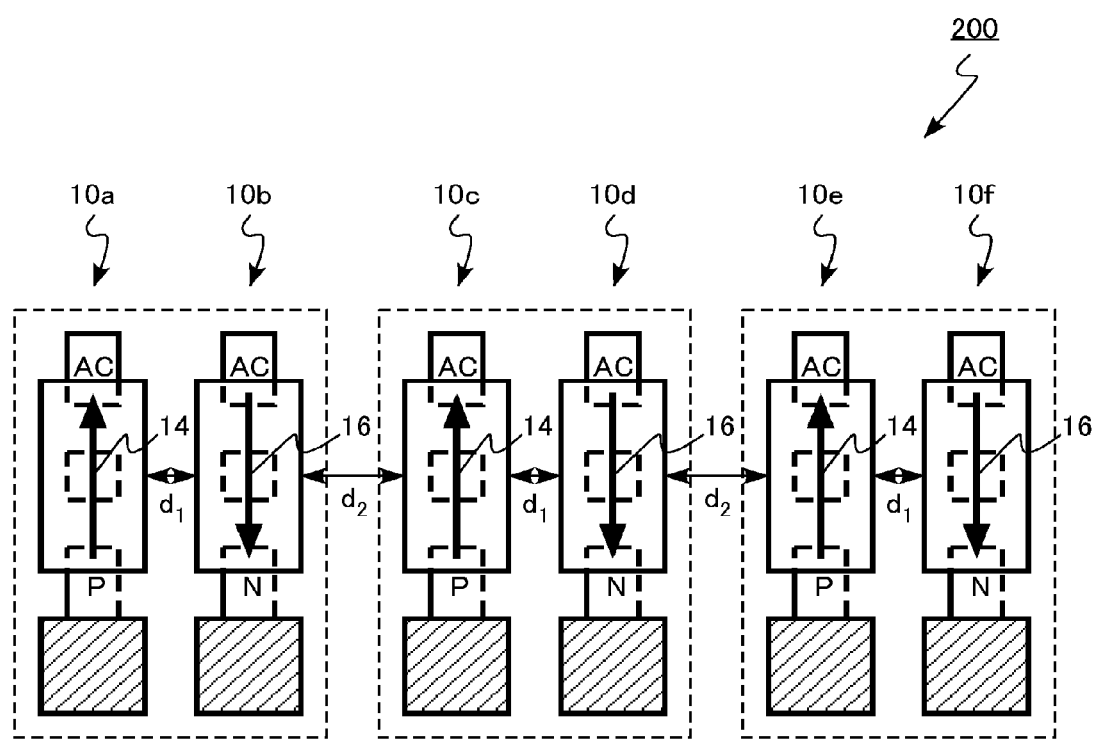
FIG. 10 is an explanatory drawing of functions of the semiconductor device of the sixth embodiment.

FIG. 10 is a drawing showing the functions and effects of the semiconductor device of the present embodiment. Arrows in FIG. 10 show current paths in the front side of the semiconductor module 200. As shown in FIG. 10, the directions of the current paths in the mutually adjacent circuit units are mutually reversed. Therefore, cancel-out of magnetic flux occurs between the mutually adjacent circuit units, and mutual inductance is suppressed. Therefore, the inductance of the semiconductor module 200 is reduced more than the semiconductor module 100 of the fifth comparative embodiment.

Furthermore, the distance between the two circuit units forming a pair ($d_1$ in FIG. 9, FIG. 10) is shorter than the distance between the two circuit units not forming a pair ($d_2$ in FIG. 9, FIG. 10).

Therefore, interference of the magnetic flux between the two circuit units not forming a pair can be suppressed to be small. Therefore, non-uniformity (edge effect) in the magnetic-flux cancel-out effect caused since the semiconductor module 200 is provided with ends is suppressed. Therefore, non-uniformity in inductance in the semiconductor module 200 is suppressed.

According to the present embodiment, as well as the fifth embodiment, the semiconductor module 200 which reduces inductance, can suppress occurrence of element breakdown and noise, and can suppress switching loss is realized. Furthermore, the inductance of the semiconductor module 200 is further reduced by alternately changing disposition of the circuit units. Moreover, the inductance of the semiconductor module 200 can be uniformized by alternately changing the distances between the circuit units.

Seventh Embodiment

An inverter circuit and a drive device of the present embodiment are an inverter circuit and a drive device provided with the semiconductor device of the fifth embodiment.

Figure 11:
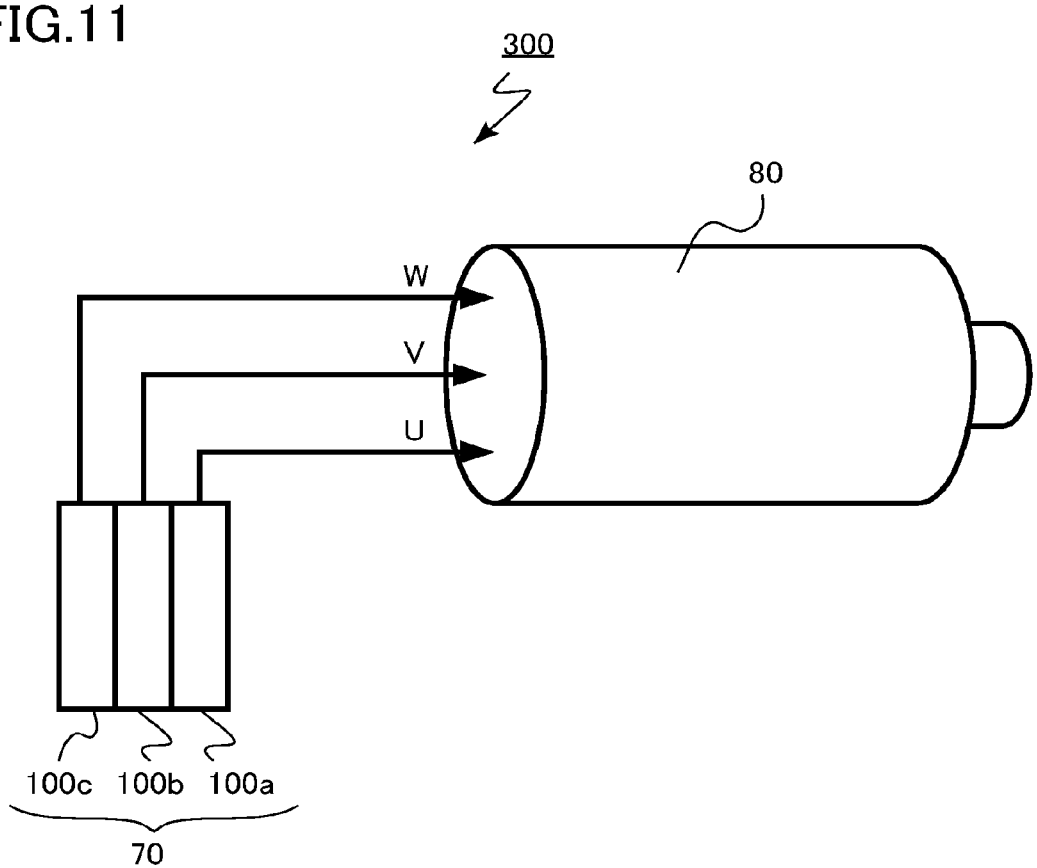
FIG. 11 is a schematic diagram of a semiconductor device of a seventh embodiment.

FIG. 11 is a schematic diagram of the drive device of the present embodiment. A drive device 300 is provided with a motor 80 and an inverter circuit 70.

The inverter circuit 70 is composed of three semiconductor modules 100a, 100b, and 100c having the same configuration as the semiconductor module 100 of the fifth embodiment. The three-phase inverter circuit 70 provided with three output terminals U, V, and W of alternating voltages is realized by connecting the three semiconductor modules 100a, 100b, and 100c in parallel. The motor 80 is driven by the alternating-current voltages output from the inverter circuit 70.

Also in the inverter circuit 70 and the drive device 300 of the present embodiment, since the inductance of the semiconductor modules 100a, 100b, and 100c is reduced, occurrence of element breakdown and noise can be suppressed, and switching loss can be suppressed.

Hereinabove, in the first to seventh embodiments, the first switching element and the second switching element have been explained by taking MOSFETs as examples; however, insulated gate bipolar transistors (IGBTs), high electron mobility transistors (HEMTs), etc. can be also applied.

Moreover, in the first to seventh embodiments, silicon carbide (SiC) has been explained as an example of a semiconductor material of the first switching element and the second switching element; however, silicon (Si), gallium nitride (GaN), etc. can be also applied.

Moreover, in the fifth and sixth embodiments, the case in which the circuit units are provided with individually independent capacitor parts has been explained; however, all the circuit units can be configured to share a single capacitor part.

While certain embodiments have been described, these embodiments have been presented by way of example only, and are not intended to limit the scope of the inventions. Indeed, a semiconductor device, an inverter circuit, and a drive device described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor device comprising:
    a first electrode;
    a second electrode;
    an alternating-current electrode;
    a first switching element provided between the first electrode and the alternating-current electrode; and
    a second switching element provided between the second electrode and the alternating-current electrode, wherein
    the first switching element and the second switching element are electrically connected in series between the first electrode and the second electrode; and
    the alternating-current electrode is electrically connected between the first switching element and the second switching element, wherein
    distances from the alternating-current electrode to the first electrode and the second electrode are longer than a distance between the first electrode and the second electrode.

2. The device according to claim 1, further comprising a capacitor electrically connected between the first electrode and the second electrode.

3. An inverter circuit comprising the semiconductor device according to claim 1.

4. A drive device comprising the semiconductor device according to claim 1.

5. The device according to claim 1, further comprising:
    a first substrate on which the first switching element is mounted; and
    a second substrate on which the second switching element is mounted, wherein
    the first switching element and the second switching element are provided between the first substrate and the second substrate.

6. The device according to claim 1, further comprising:
    a first substrate on which the first switching element is mounted; and
    a second substrate on which the second switching element is mounted, wherein
    the first substrate and the second substrate are provided between the first switching element and the second switching element.

7. The device according to claim 1, further comprising:
a substrate having a first plane on which the first switching element is mounted and a second plane on which the second switching element is mounted.

8. A semiconductor device comprising:
a first electrode;
a second electrode;
an alternating-current electrode;
a first switching element provided between the first electrode and the alternating-current electrode;
a second switching element provided between the second electrode and the alternating-current electrode;
a first substrate on which the first switching element is mounted; and
a second substrate on which the second switching element is mounted, wherein
the first switching element and the second switching element are electrically connected in series between the first electrode and the second electrode, and
the alternating-current electrode is electrically connected between the first switching element and the second switching element, and
the first switching element and the second switching element are provided between the first substrate and the second substrate.

9. The device according to claim 8, wherein
the alternating-current electrode is provided between the first substrate and the second substrate.

10. The device according to claim 8, further comprising:
a first heat dissipator; and
a second heat dissipator, wherein
the first substrate and the second substrate are provided between the first heat dissipator and the second heat dissipator.

11. The device according to claim 8, further comprising a magnetic body between the first switching element and the second switching element.

12. The device according to claim 8, further comprising a cooling mechanism provided between the first switching element and the second switching element.

13. A semiconductor device comprising:
a first electrode;
a second electrode;
an alternating-current electrode;
a first switching element provided between the first electrode and the alternating-current electrode;
a second switching element provided between the second electrode and the alternating-current electrode;
a first substrate on which the first switching element is mounted; and
a second substrate on which the second switching element is mounted, wherein
the first switching element and the second switching element are electrically connected in series between the first electrode and the second electrode,
the alternating-current electrode is electrically connected between the first switching element and the second switching element;
the first substrate and the second substrate are provided between the first switching element and the second switching element.

14. The device according to claim 13, further comprising:
a first heat dissipator; and
a second heat dissipator, wherein
the first switching element and the second switching element are provided between the first heat dissipator and the second heat dissipator.

15. The device according to claim 13, further comprising a magnetic body provided between the first switching element and the second switching element.

16. A semiconductor device comprising:
a first electrode;
a second electrode;
an alternating-current electrode;
a first switching element provided between the first electrode and the alternating-current electrode;
a second switching element provided between the second electrode and the alternating-current electrode; and
a substrate having a first plane on which the first switching element is mounted and a second plane on which the second switching element is mounted, wherein
the first switching element and the second switching element are electrically connected in series between the first electrode and the second electrode, and
the alternating-current electrode is electrically connected between the first switching element and the second switching element.

17. The device according to claim 16, further comprising:
a first heat dissipator; and
a second heat dissipator, wherein
the first switching element and the second switching element are provided between the first heat dissipator and the second heat dissipator.

18. The device according to claim 16, further comprising a magnetic body provided between the first switching element and the second switching element.

19. A semiconductor device comprising:
a first electrode;
a second electrode;
an alternating-current electrode;
a first switching element provided between the first electrode and the alternating-current electrode; and
a second switching element provided between the second electrode and the alternating-current electrode, wherein
the first switching element and the second switching element are electrically connected in series between the first electrode and the second electrode, and
the alternating-current electrode is electrically connected between the first switching element and the second switching element,
the alternating-current electrode is provided with a first plane and a second plane,
the first switching element is provided on the first plane, and
the second switching element is provided on the second plane.

20. The device according to claim 19, further comprising:
a capacitor electrically connected between the first electrode and the second electrode.

* * * * *